(12) United States Patent
Noma (10) Patent No.: US 9,305,576 B2
(45) Date of Patent: Apr. 5, 2016

(54) MAGNETORESISTIVE ELEMENT (71) Applicant: KABUSHIKI KAISHA TOSHIBA, Minato-ku, Tokyo (JP)

(72) Inventor: Kenji Noma, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/638,767

(22) Filed: Mar. 4, 2015

(65) Prior Publication Data
US 2016/0072049 A1    Mar. 10, 2016

Related U.S. Application Data (60) Provisional application No. 62/048,117, filed on Sep. 9, 2014.

(51) Int. Cl.
*G11B 5/02*   (2006.01)
*G11B 5/33*   (2006.01)
*G11B 5/31*   (2006.01)

(52) U.S. Cl.
CPC ..................... *G11B 5/314* (2013.01)

(58) Field of Classification Search
CPC .............. G11B 5/3903; G11B 5/6005; G11B 2005/0021; G11B 2005/0005; G11B 5/314; B82Y 25/00; B82Y 10/00
USPC .............. 360/324.11, 49, 324.12, 234.3, 313, 360/314
See application file for complete search history.

(56) References Cited

U.S. PATENT DOCUMENTS

| | | | |
|---|---|---|---|
| 6,519,122 B1 * | 2/2003 | Kakihara | 360/324.12 |
| 7,027,271 B2 * | 4/2006 | Inage et al. | 360/322 |
| 7,061,034 B2 | 6/2006 | Park et al. | |
| 8,223,533 B2 | 7/2012 | Ozeki et al. | |
| 8,357,982 B2 | 1/2013 | Kajiyama | |
| 8,488,375 B2 | 7/2013 | Saida et al. | |
| 8,599,605 B2 * | 12/2013 | Katou | 365/158 |
| 2009/0251951 A1 | 10/2009 | Yoshikawa et al. | |

FOREIGN PATENT DOCUMENTS

| | | |
|---|---|---|
| JP | 2008171882 A | 7/2008 |
| JP | 2012059807 A | 3/2012 |
| JP | 2013008865 A | 1/2013 |

OTHER PUBLICATIONS

U.S. Appl. No. 14/562,087; First Named Inventor: Kenji Noma; Title: "Magnetoresistive Element and Method of Manufacturing the Same"; Filed: Dec. 5, 2014.

* cited by examiner

Primary Examiner — Nabil Hindi
(74) Attorney, Agent, or Firm — Holtz, Holtz & Volek PC (57) ABSTRACT

According to one embodiment, a magnetoresistive element includes a first magnetic layer as a reference layer, a second magnetic layer as a storage layer, a nonmagnetic insulating layer between the first and second magnetic layers, and an antiferromagnetic conductive layer which is adjacent to a side opposite to the nonmagnetic insulating layer side of the second magnetic layer in a vertical direction in which the first and second magnetic layers are stacked. The second magnetic layer includes an area which is magnetically coupled with the antiferromagnetic conductive layer and which has a magnetization direction parallel with a magnetization direction of the second magnetic layer.

18 Claims, 12 Drawing Sheets

MAGNETORESISTIVE ELEMENT

CROSS-REFERENCE TO RELATED APPLICATIONS

This application claims the benefit of U.S. Provisional Application No. 62/048,117, filed Sep. 9, 2014, the entire contents of which are incorporated herein by reference.

FIELD

Embodiments described herein relate generally to a magnetoresistive element.

BACKGROUND

The magnetoresistive element includes a reference layer having invariable magnetization, a storage layer having variable magnetization, and a nonmagnetic layer (a tunnel barrier layer) provided therebetween as its basic structure. When the reference layer and the storage layer have the same magnetization direction, the magnetoresistive element will be in a low-resistance state (i.e., a parallel state), and this state is referred to as, for example, the "0"-write state. Further, when the reference layer and the storage layer have different magnetization directions, the magnetoresistive element will be in a high-resistance state (i.e., an antiparallel state), and this state is referred to as, for example, the "1"-write state.

A write operation to bring the magnetoresistive element to the parallel state or the antiparallel state is performed by passing a write current (a spin injection current) to the magnetoresistive element, when, for example, spin-transfer torque (STT) writing is adopted. Here, from the standpoint of using less current, a value of the write current necessary for magnetic reversal of the storage layer should preferably be as small as possible. However, this means that the magnetic reversal of the storage layer becomes easy. In this case, after writing, magnetic stability (retention) of the storage layer is deteriorated.

As can be seen, reduction of a write current necessary for the magnetic reversal of the storage layer and magnetic stability of the storage layer after writing have a trade-off relationship.

DETAILED DESCRIPTION

In general, according to one embodiment, a magnetoresistive element comprises: a first magnetic layer as a reference layer; a second magnetic layer as a storage layer; a nonmagnetic insulating layer between the first and second magnetic layers; and an antiferromagnetic conductive layer which is adjacent to a side opposite to the nonmagnetic insulating layer side of the second magnetic layer in a vertical direction in which the first and second magnetic layers are stacked. The second magnetic layer includes an area which is magnetically coupled with the antiferromagnetic conductive layer and which has a magnetization direction parallel with a magnetization direction of the second magnetic layer.

1. Magnetoresistive Element (1) Structure

Figure 1A:
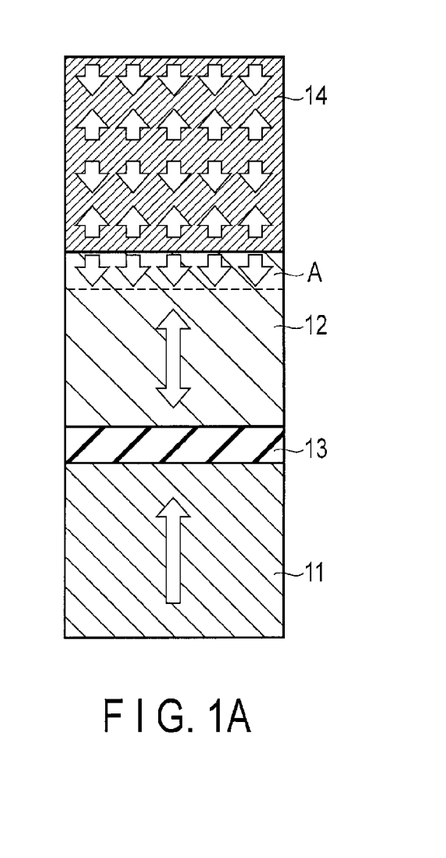
FIGS. 1A and 1B are cross-sectional views showing magnetoresistive elements according to embodiments.
Figure 1B:
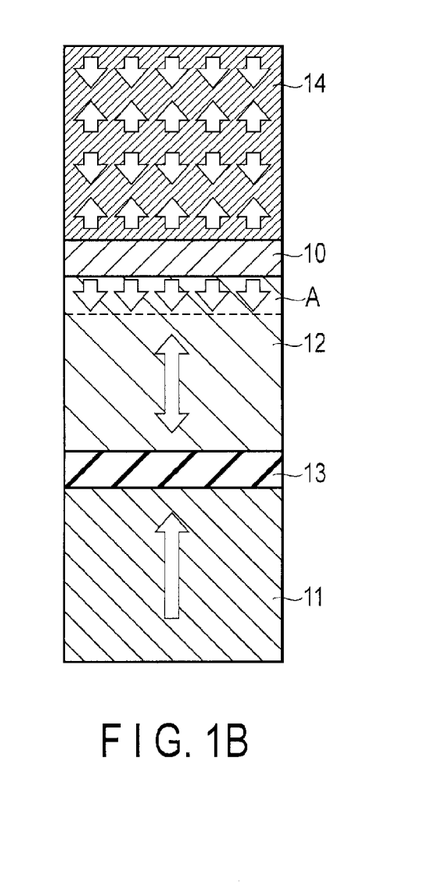

Each of FIGS. 1A and 1B shows an embodiment of a magnetoresistive element.

The embodiment is characterized in that in a magnetoresistive element which comprises a first magnetic layer (a reference layer) 11 having invariable magnetization, a second magnetic layer (a storage layer) 12 having variable magnetization, and a nonmagnetic insulating layer (a tunnel barrier layer) 13 provided therebetween, the magnetization of the second magnetic layer 12 after writing is stabilized by adding an antiferromagnetic conductive layer 14 which is magnetically coupled with the second magnetic layer 12 by exchange coupling.

Here, the invariable magnetization means that the magnetization direction does not change before and after writing, and the variable magnetization means that the magnetization direction may be changed to an opposite direction before and after the writing.

Further, the writing means spin-transfer writing which applies a spin torque to the magnetization of the second magnetic layer 12 by passing a write current (spin-polarized electrons) to the magnetoresistive element.

In this embodiment, it should be noted that which of the first magnetic layer 11 and the second magnetic layer 12 should come at the top is not particularly limited. That is, the second magnetic layer 12 may be provided above the first magnetic layer 11, or the first magnetic layer 11 may be provided above the second magnetic layer 12.

Also, in the present embodiment, the so-called perpendicular magnetization type magnetoresistive element is given as an example. However, alternatively, the so-called in-plane magnetization type magnetoresistive element may be adopted.

Each of FIGS. 1A and 1B is a drawing which schematically shows the magnetoresistive element, and the size of each constituent element of the magnetoresistive element differs from the actual size.

The magnetoresistive element of FIG. 1A comprises the first magnetic layer 11 having invariable magnetization, the second magnetic layer 12 having variable magnetization, and the nonmagnetic insulating layer 13 provided therebetween.

A magnetization direction of remanent magnetization of the first magnetic layer 11 is a direction in which the first and the second magnetic layers 11 and 12 are stacked (i.e., a vertical direction). In this embodiment, the remanent magnetization of the first magnetic layer 11 is directed toward the nonmagnetic insulating layer 13. However, alternatively, it may be directed away from the nonmagnetic insulating layer 13.

The nonmagnetic insulating layer 13 serves as a tunnel barrier layer. Accordingly, the thickness of the nonmagnetic insulating layer 13 in the vertical direction should preferably be several nanometers or less, for example, 1 nm or so.

The antiferromagnetic conductive layer 14 is disposed on a side of the second magnetic layer 12, which is opposite the nonmagnetic insulating layer 13. Also, the second magnetic layer 12 includes an area A which is magnetically coupled with the antiferromagnetic conductive layer 14 by exchange coupling, and has a magnetization direction parallel with a magnetization direction of the second magnetic layer 12.

In the present embodiment, since magnetization directions of the first and the second magnetic layers 11 and 12 are the vertical direction, a magnetization direction of the area A is also the vertical direction.

In this embodiment, the area A is subjected to exchange coupling in the magnetization direction which is opposite to the magnetization direction of the first magnetic layer 11. However, alternatively, the area A may be subjected to exchange coupling in a magnetization direction which is the same as the magnetization direction of the first magnetic layer 11.

The area A has the function of keeping a magnetization direction of remanent magnetization of the second magnetic layer 12 in the vertical direction. That is, the area A has the advantage of improving the magnetic stability (retention) of the second magnetic layer 12 after writing by the exchange coupling between the second magnetic layer 12 and the antiferromagnetic conductive layer 14.

However, since the antiferromagnetic conductive layer 14 fixes the magnetization of a part of (only the area A of) the second magnetic layer 12, the remaining portion of the second magnetic layer 12 serves as the storage layer having variable magnetization.

Accordingly, the thickness of the antiferromagnetic conductive layer 14 in the vertical direction is set to an appropriate value in accordance with, for example, materials of the second magnetic layer 12 and the antiferromagnetic conductive layer 14, such that only the magnetization within the area A of the second magnetic layer 12 is fixed.

Meanwhile, a thermal stability index ($\Delta$ value) is used as an index representing the magnetic stability. The $\Delta$ value is the ratio of the magnetic anisotropy energy E1 to the thermal energy E2 of the second magnetic layer (the storage layer) 12 (E1/E2), and the greater the $\Delta$ value is, the more the magnetization of the second magnetic layer 12 is stabilized.

Recently, by miniaturization of the magnetoresistive element, the volume of the second magnetic layer 12 tends to be reduced, and this means that the magnetic anisotropy energy of the second magnetic layer 12 tends to be reduced. This tendency is desirable for reducing the write current, but is not desirable in terms of the magnetic stability of the second magnetic layer 12.

Hence, a new technology of improving the magnetic stability of the second magnetic layer 12 is desired. However, in terms of the material of the second magnetic layer 12, a solution which can be conceived of is only increasing the magnetic anisotropy energy, that is, for example, increasing the anisotropic magnetic field and saturation magnetization.

However, the above solution means increasing the write current, and thus after all, the solution does not improve the situation of a trade-off between reduction of the write current necessary for the magnetic reversal of the second magnetic layer 12 and magnetic stability of the second magnetic layer 12 after writing.

In contrast, if the technology of partially fixing the magnetization of the second magnetic layer 12 by the antiferromagnetic conductive layer 14 (i.e., causing the second magnetic layer 12 to be coupled with the antiferromagnetic conductive layer 14 by exchange coupling) is adopted, as described above, the $\Delta$ value can be increased without increasing the anisotropic magnetic field or the saturation magnetization of the second magnetic layer 12.

Accordingly, for example, in terms of the material of the second magnetic layer 12, the write current is reduced by reducing the anisotropic magnetic field and the saturation magnetization. Together with that, in terms of the exchange coupling between the second magnetic layer 12 and the antiferromagnetic conductive layer 14, the $\Delta$ value can be increased. Consequently, the situation of a trade-off between reduction of the write current necessary for the magnetic reversal of the second magnetic layer 12 and magnetic stability of the second magnetic layer 12 after writing can be improved.

Note that the materials of the second magnetic layer 12 and the antiferromagnetic conductive layer 14, thicknesses of these layers, and a crystal structure/orientation, etc., should preferably be controlled such that the exchange coupling between the second magnetic layer 12 and the antiferromagnetic conductive layer 14 exhibits uniaxial anisotropy, not unidirectional anisotropy.

Further, in FIG. 1A, when the area A has a magnetization direction opposite to the magnetization direction of the first magnetic layer 11, the area A also has the advantage of cancelling a shift of a magnetization reversal characteristic of the second magnetic layer 12.

That is, the area A produces a second stray magnetic field which is opposite to a first stray magnetic field caused by the first magnetic layer 11. Accordingly, since the first and the second stray magnetic fields cancel each other out, it is possible to cancel the shift of the magnetization reversal characteristic of the second magnetic layer 12.

A magnetoresistive element shown in FIG. 1B is a modification of the magnetoresistive element of FIG. 1A.

As compared to the magnetoresistive element of FIG. 1A, the magnetoresistive element of FIG. 1B is characterized in that a nonmagnetic conductive layer 10 is further disposed between the second magnetic layer 12 having variable magnetization and the antiferromagnetic conductive layer 14. Since the other parts of the magnetoresistive element of FIG. 1B are the same as those of FIG. 1A, explanation of the same parts will not be provided here.

The nonmagnetic conductive layer 10 has the function of adjusting a range of the exchange coupling between the second magnetic layer (the storage layer) 12 and the antiferromagnetic conductive layer 14, that is, a width of the area A in the vertical direction. For example, as described above, the second magnetic layer 12 needs to be made to function as a storage layer in which the magnetization of a part near the antiferromagnetic conductive layer 14 (only the area A) is fixed, and the remaining portion of the second magnetic layer 12 has variable magnetization.

However, if the thickness of the second magnetic layer 12 in the vertical direction is reduced, causing the second magnetic layer 12 to function as such becomes difficult, and it is possible that the magnetization of the entire portion of the second magnetic layer 12 will be fixed as a consequence.

In order to avoid such an event, further providing the nonmagnetic conductive layer 10 between the second magnetic layer 12 and the antiferromagnetic conductive layer 14 is an effective measure.

Also, the material of the nonmagnetic conductive layer 10 should preferably be one which can favorably exchange-couple the second magnetic layer 12 and the antiferromagnetic conductive layer 14 with uniaxial anisotropy, not unidirectional anisotropy. The nonmagnetic conductive layer 10 can be selected from the group consisting of Ta, W, Ti, Nb, Hf, Al, and B, for example.

Meanwhile, in order to increase the magnetoresistive (MR) ratio of the magnetoresistive element of FIGS. 1A and 1B, when the first and the second magnetic layers 11 and 12 contain CoFeB, the nonmagnetic insulating layer 13 should preferably comprise a material having the NaCL structure which is (001) oriented in the vertical direction, such as MgO.

On the other hand, the antiferromagnetic conductive layer 14 for stabilizing the remanent magnetization of the second magnetic layer 12 is disposed on a side of the second magnetic layer 12, which is opposite the nonmagnetic insulating layer 13. Accordingly, the antiferromagnetic conductive layer 14 does not affect the MR ratio of the magnetoresistive element.

For this reason, the antiferromagnetic conductive layer 14 can be arbitrarily selected from any of conductive layers having antiferromagnetic properties without having the limitations of a crystal orientation, a crystal structure, etc.

For example, for the antiferromagnetic conductive layer 14, PtMn, PdMn, IrMn, RhMn, RuMn, NiMn, FeMn, CoMn, CrMn, etc., can be used.

(2) Magnetization Stabilizing Effect

Figure 2:
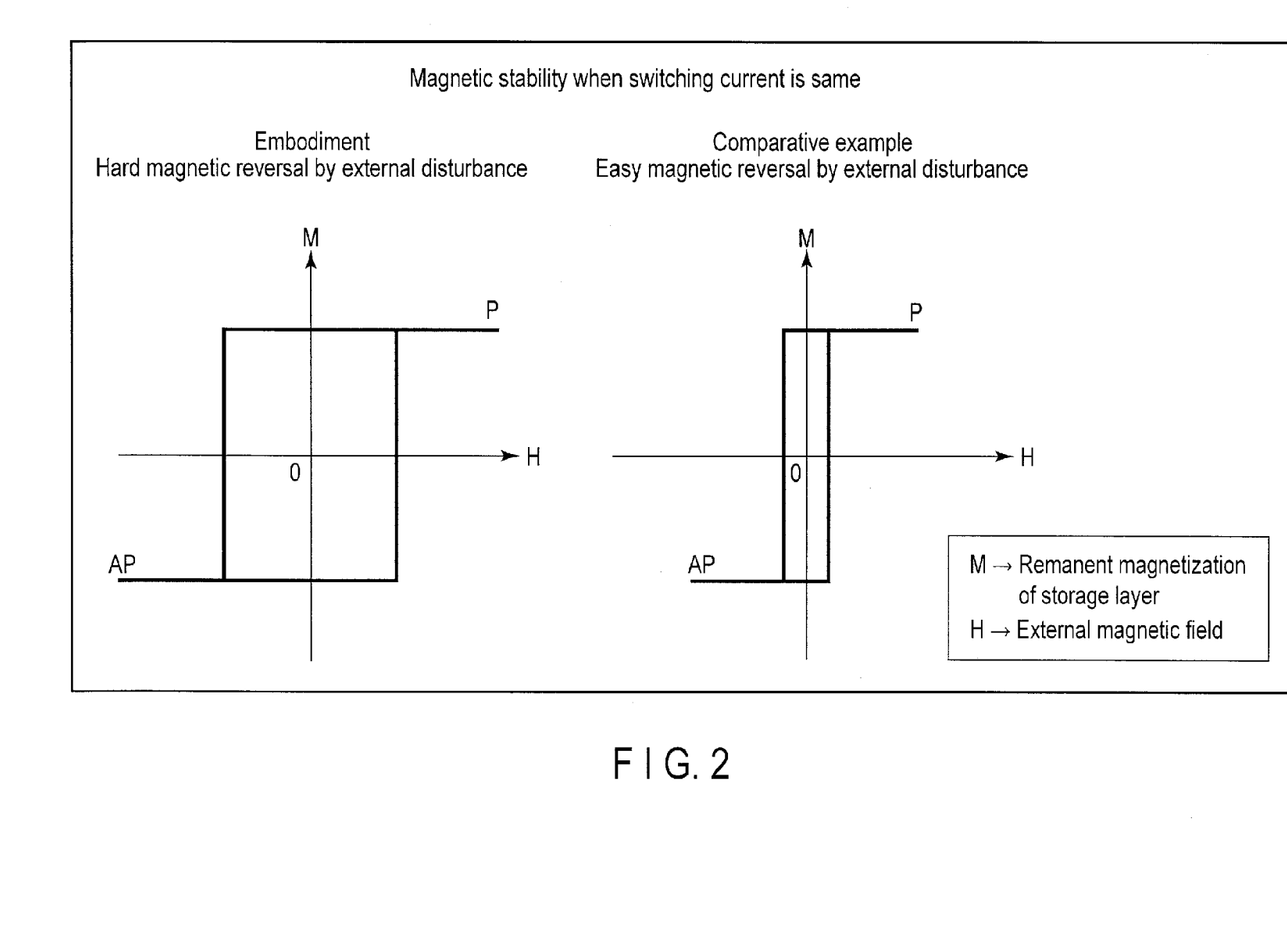
FIG. 2 is a diagram showing magnetization stabilizing effect.

FIG. 2 shows the magnetization stabilizing effect according to the embodiment described above.

In this figure, a comparative example has the same structure as that of the embodiment, but in this case, magnetic stability using the antiferromagnetic conductive layer is not performed. For example, in the case of FIG. 1A, the embodiment has the structure of FIG. 1A as it is, but the comparative example has the structure in which the antiferromagnetic conductive layer 14 of FIG. 1A is omitted.

Also, a hysteresis curve of this figure shows the degree of easiness/difficulty (disturbs) of the magnetic reversal of the storage layer by an external magnetic field after writing when it is supposed that a value of the write current (a switching current) for the magnetic reversal of the second magnetic layer (the storage layer) is the same in the embodiment and the comparative example.

The horizontal axis of a graph showing the hysteresis curve of FIG. 2 represents the magnitude of the external magnetic field, and the vertical axis represents the intensity of the remanent magnetization of the second magnetic layer (the storage layer).

As is clear from this figure, by adding the antiferromagnetic conductive layer to the magnetoresistive element, magnetization of the second magnetic layer (the storage layer) is hard to be reversed by external disturbance. That is, in the present embodiment, the magnetization of the second magnetic layer (the storage layer) after writing does not reverse unless a large external magnetic field is applied. In contrast, in the comparative example, the magnetization of the second magnetic layer (the storage layer) after writing is easily reversed by a small external magnetic field.

(3) Write Operation

In the magnetoresistive element of the embodiment described above, a write operation is performed by passing a write current (spin-polarized electrons) to the magnetoresistive element. By taking the structure of FIG. 1A as an example, the write operation will be hereinafter described.

Here, the state in which the magnetization directions of the first and the second magnetic layers 11 and 12 are the same is defined as the parallel state ("0" state) P, and the state in which the magnetization directions of the first and the second magnetic layers 11 and 12 are opposite is defined as the antiparallel state ("1" state) AP. Further, it is assumed that the resistance of the magnetoresistive element in the parallel state P is lower than the resistance of the magnetoresistive element in the antiparallel state AP.

Figure 3:
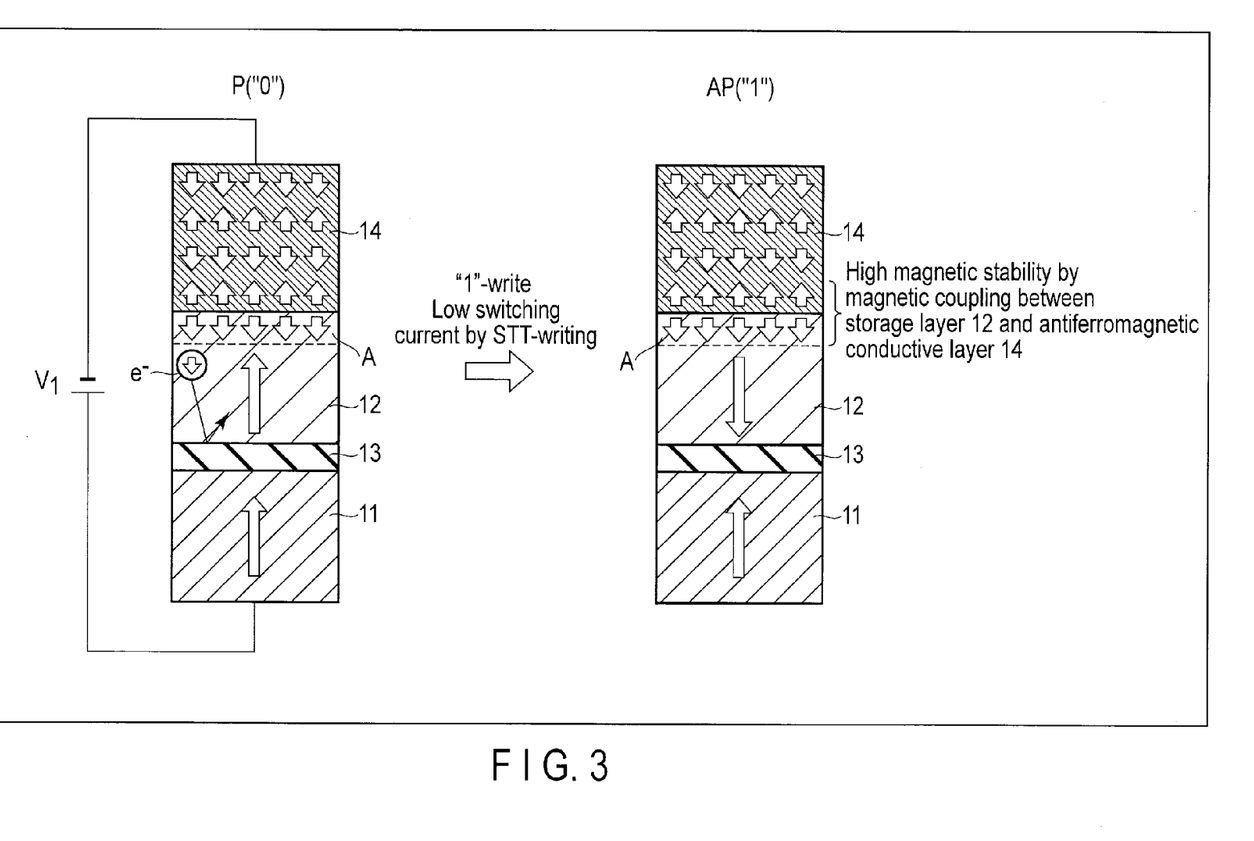
FIG. 3 is a diagram showing an example of "1"-write operation.

With reference to FIG. 3, a write operation of changing the state of a magnetoresistive element from the parallel state P to the antiparallel state AP will be described.

For example, when the second magnetic layer 12 is set at 0v, and the first magnetic layer 11 is set to have a positive potential V1, a write current flows from the first magnetic layer 11 to the second magnetic layer 12. At this time, electrons $e^-$ flow from the second magnetic layer 12 to the first magnetic layer 11.

Of the electrons flowing from the second magnetic layer 12 to the first magnetic layer 11, majority-spin electrons in the second magnetic layer 12, that is, the (upward) electrons which have been spin-polarized in the same direction as the magnetization direction (i.e., the upward magnetization) of the first magnetic layer 11, are stored in the first magnetic layer 11. Further, of the electrons flowing from the second magnetic layer 12 to the first magnetic layer 11, minority-spin electrons in the second magnetic layer 12, that is, the (downward) electrons which have been spin-polarized in a direction opposite to the magnetization direction (i.e., the upward magnetization) of the first magnetic layer 11, are returned to the second magnetic layer 12, and a spin torque is applied to the magnetization in the second magnetic layer 12. Accordingly, the magnetization direction of the second magnetic layer 12 is changed to the same direction as the magnetization direction of the first magnetic layer 11 (i.e., the state being changed to the antiparallel state).

Figure 4:
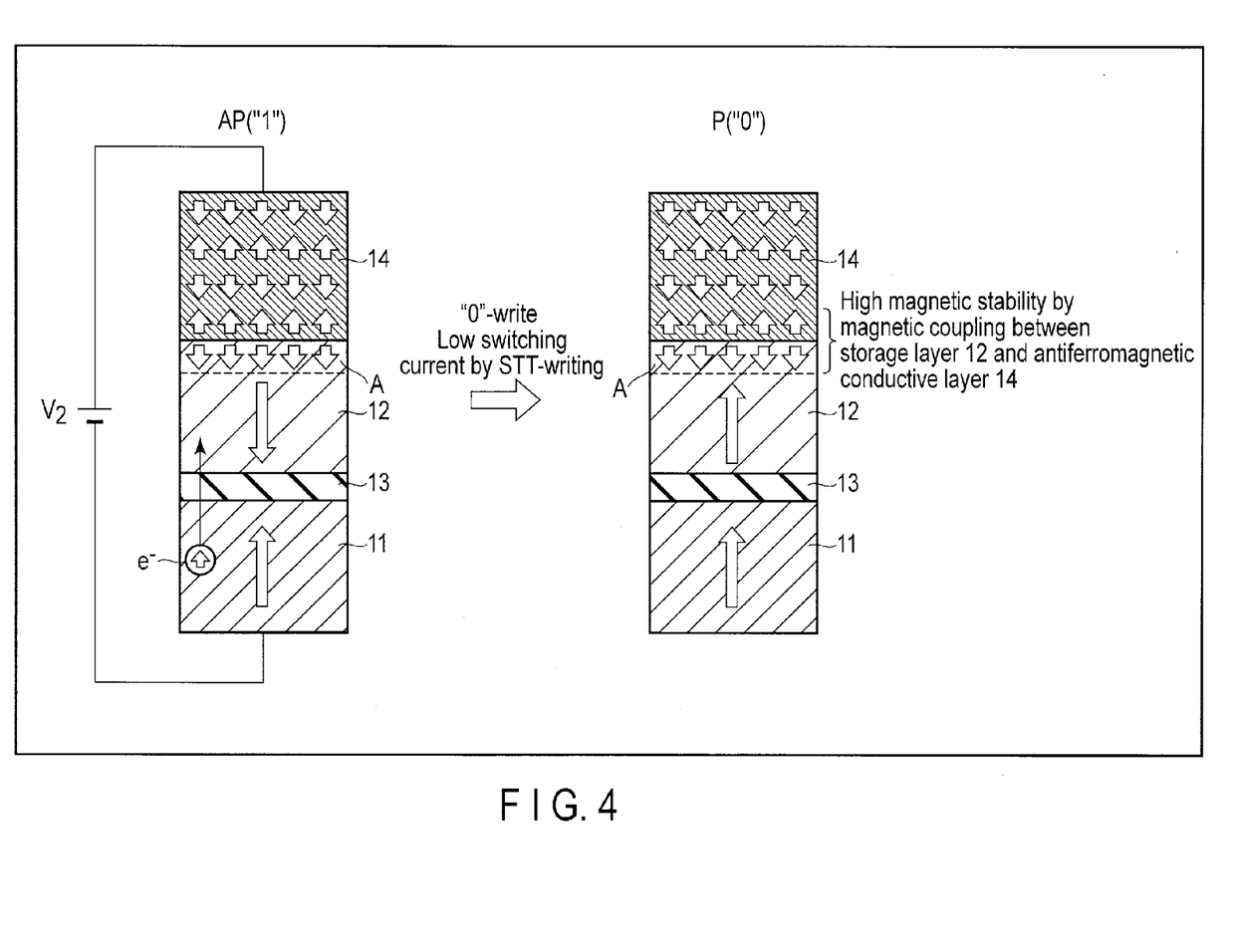
FIG. 4 is a diagram showing an example of "0"-write operation.

With reference to FIG. 4, a write operation of changing the state of the magnetoresistive element from the antiparallel state AP to the parallel state P will be described.

For example, when the second magnetic layer 12 is set to have a positive potential V2, and the first magnetic layer 11 is set at 0v, a write current flows from the second magnetic layer 12 to the first magnetic layer 11. At this time, electrons $e^-$ flow from the first magnetic layer 11 to the second magnetic layer 12.

Of the electrons flowing from the first magnetic layer 11 to the second magnetic layer 12, minority-spin electrons in the second magnetic layer 12, that is, the (upward) electrons which have been spin-polarized in the same direction as the magnetization direction (i.e., the upward magnetization) of the first magnetic layer 11, are stored in the second magnetic layer 12, and a spin torque is applied to the magnetization in the second magnetic layer 12. Accordingly, the magnetization direction of the second magnetic layer 12 is changed to the same direction as the magnetization direction of the first magnetic layer 11 (i.e., the state being changed to the parallel state).

(4) Manufacturing Method

An example of a method of manufacturing the magnetoresistive element of the above embodiment will be described.

The manufacturing method has the feature in the way in which the second magnetic layer and the antiferromagnetic conductive layer are exchange-coupled. By taking the structure of FIG. 1A as an example, the manufacturing method will be hereinafter described.

First Example

Figures 5A, 5B:
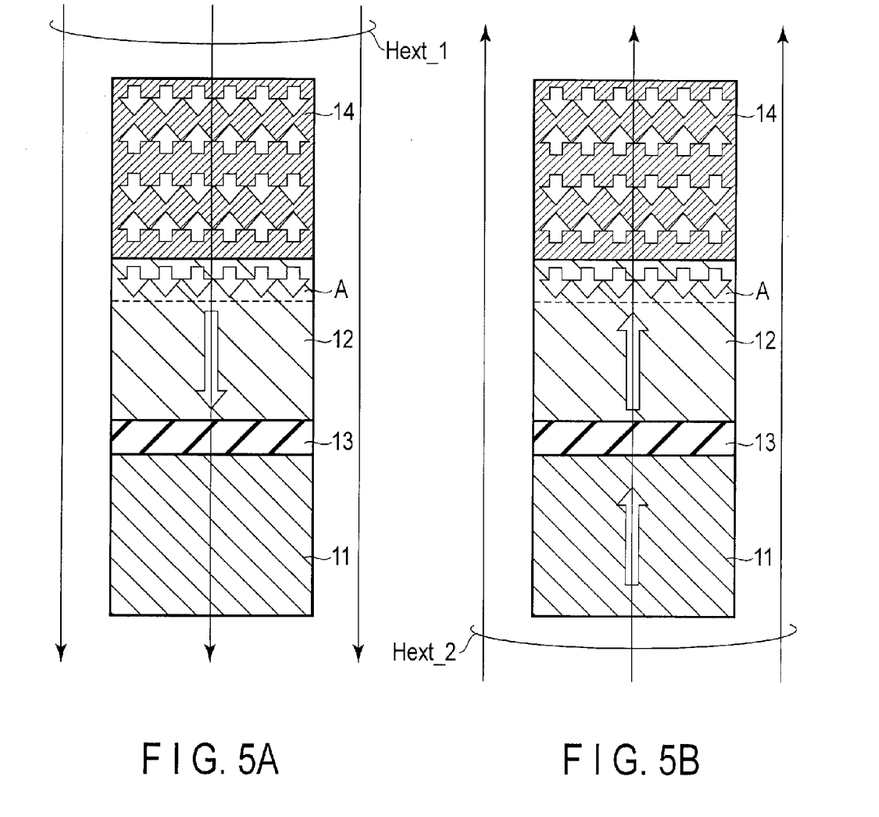
FIGS. 5A and 5B are diagrams showing a first example of a method of manufacturing the magnetoresistive element.

FIGS. 5A and 5B show a first example of the manufacturing method.

Firstly, as shown in FIG. 5A, a magnetoresistive element comprising the first magnetic layer 11, the second magnetic layer 12, the nonmagnetic insulating layer 13, and the antiferromagnetic conductive layer 14 is formed.

After that, in a state where external magnetic field Hext_1 in a first (downward) direction is applied, by changing a temperature from a value greater than blocking temperature Tb determined by the second magnetic layer 12 and the antiferromagnetic conductive layer 14 to a value less than blocking temperature Tb, the second magnetic layer 12 and the antiferromagnetic conductive layer 14 are magnetically coupled by exchange coupling, and an area A in which the magnetization direction conforms to the first direction is formed in the second magnetic layer 12.

Next, as shown in FIG. 5B, after forming the area A in the second magnetic layer 12, by applying external magnetic field Hext_2 in a second (upward) direction which is opposite to the first (downward) direction, the magnetization direction of the second magnetic layer 12 is steered to the second direction.

Second Example

Figure 6A:
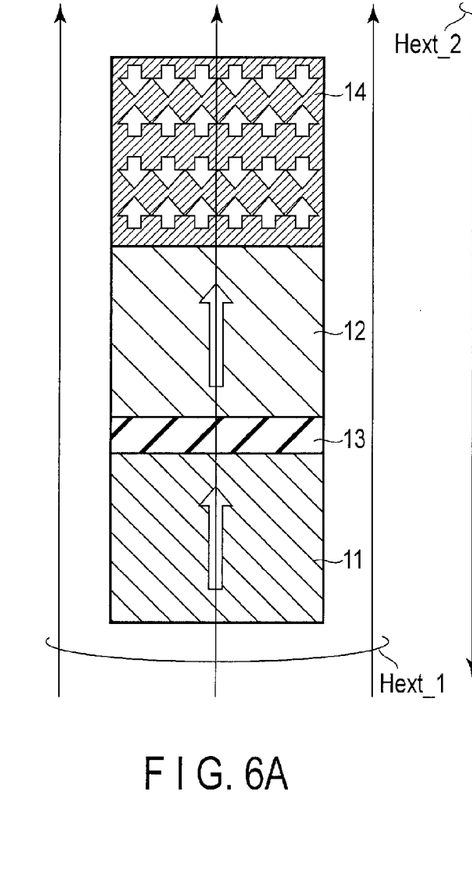
FIGS. 6A and 6B are diagrams showing a second example of a method of manufacturing the magnetoresistive element.
Figure 6B:
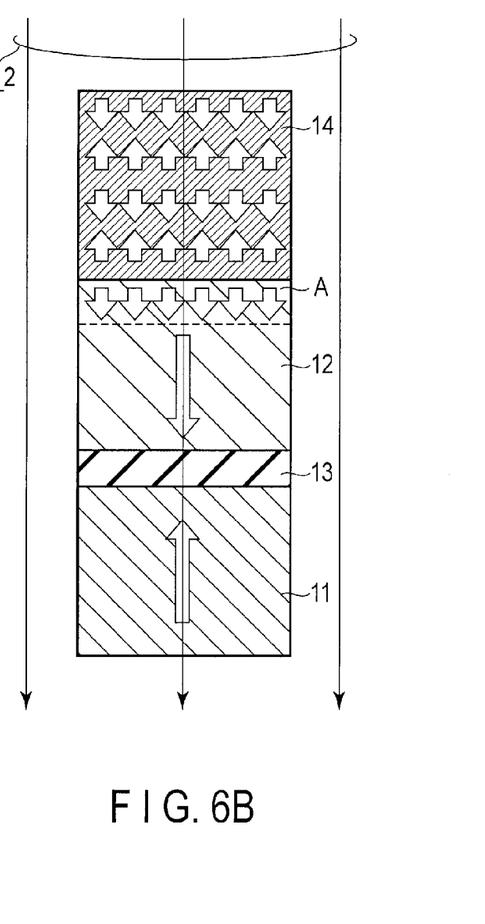

FIGS. 6A and 6B show a second example of the manufacturing method.

Firstly, as shown in FIG. 6A, a magnetoresistive element comprising the first magnetic layer 11, the second magnetic layer 12, the nonmagnetic insulating layer 13, and the antiferromagnetic conductive layer 14 is formed.

After that, by applying external magnetic field Hext_1 in a first (upward) direction, the magnetization direction of the first magnetic layer is made to conform to the first direction.

Next, as shown in FIG. 6B, after steering the magnetization direction of the first magnetic layer 11 to the first direction, in a state where external magnetic field Hext_2 in a second (downward) direction, which is opposite to the first (upward) direction, is applied, by changing a temperature from a value greater than blocking temperature Tb determined by the second magnetic layer 12 and the antiferromagnetic conductive layer 14 to a value less than blocking temperature Tb, the second magnetic layer 12 and the antiferromagnetic conductive layer 14 are magnetically coupled by exchange coupling, and an area A in which the magnetization direction conforms to the second direction is formed in the second magnetic layer 12.

Blocking Temperature

Blocking temperature Tb at which the second magnetic layer 12 and the antiferromagnetic conductive layer 14 are exchange-coupled differs for each material which constitutes the aforementioned layers.

For example, when the second magnetic layer 12 is made of CoFeB, blocking temperature Tb varies according to the material of the antiferromagnetic conductive layer 14 as described below.

For example, Tb of NiMn of the fct structure is approximately 380°, Tb of PtMn of the fct structure is approximately 350°, Tb of IrMn of the fct structure is approximately 300°, Tb of CrMn of the bct structure is approximately 250°, Tb of PdMn of the fct structure is approximately 250°, and Tb of FeMn of the fcc structure is approximately 150°.

(5) Example of Material

Referring to FIGS. 1A and 1B, the first magnetic layer 11 and the second magnetic layer 12 include a magnetic material of any of Co, Fe, Ni, and Mn. Also, the first and the second magnetic layers 11 and 12 may include oxygen (O). In this case, the amount of oxygen may be varied in the first and the second magnetic layers 11 and 12.

The first and the second magnetic layers 11 and 12 may comprise, for example, CoFeB, MgFeO, and a lamination of these materials.

In the case of a magnetoresistive element having perpendicular magnetization, the first and the second magnetic layers 11 and 12 should preferably comprise TbCoFe having perpendicular magnetic anisotropy, an artificial lattice in which Co and Pt are stacked, L1o-ordered FePt, etc.

2. Application Example

Figure 7:
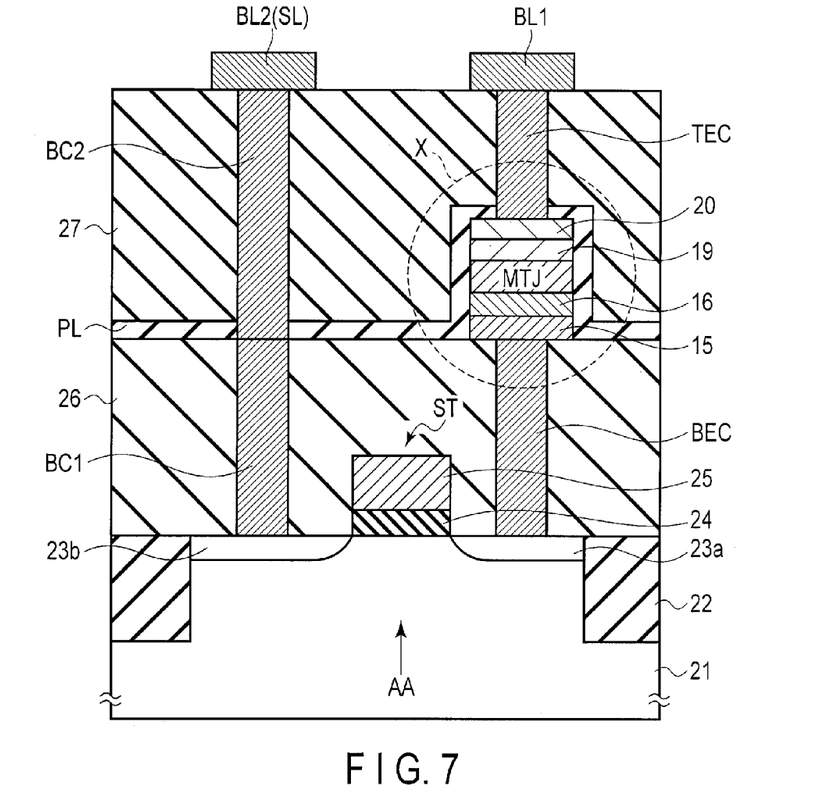
FIG. 7 is a cross-sectional view showing a memory cell as an example of application.

FIG. 7 shows an example of a memory cell of a magnetic memory.

In this example, the memory cell of the magnetic memory comprises a select transistor (for example, an FET) ST and a magnetoresistive element MTJ. The magnetoresistive element MTJ is a magnetoresistive element of the above embodiment.

The select transistor ST is arranged within an active area AA in a semiconductor substrate 21. The active area AA is surrounded by an element isolation insulating layer 22 in the semiconductor substrate 21. In this example, the element isolation insulating layer 22 has a shallow trench isolation (STI) structure.

The select transistor ST comprises source/drain diffusion layers 23a and 23b in the semiconductor substrate 21, a gate insulating layer 24 on a channel between these source/drain diffusion layers 23a and 23b, and a gate electrode 25 on the gate insulating layer 24. The gate electrode 25 serves as a word line.

An interlayer insulating layer (for example, a silicon oxide layer) 26 covers the select transistor ST. Contact plugs BEC and BC1 are arranged within the interlayer insulating layer 26. An upper surface of the interlayer insulating layer 26 is flat, and a bottom electrode (a first electrode) 15 is arranged on the interlayer insulating layer 26.

The bottom electrode 15 comprises, for example, one of Al, Be, Mg, Ca, Sr, Ba, Sc, Y, La, Zr, and Hf, an alloy including one of the aforementioned elements, or a compound of one of the aforementioned elements or the alloy and B (for example, HfB, MgAlB, HfAlB, ScAlB, ScHfB, HfMgB, etc.).

The bottom electrode 15 is connected to the source/drain diffusion layer 23a of the select transistor ST via contact plug (bottom electrode contact) BEC. Contact plug BC1 is connected to the source/drain diffusion layer 23b of the select transistor ST.

An under layer 16 is disposed on the bottom electrode 15. The under layer 16 is provided to crystallize the magnetoresistive element MTJ. The under layer 16 should preferably contain, for example, MgO or a nitrogen compound such as AlN, MgN, ZrN, NbN, SiN, and AlTiN.

The magnetoresistive element MTJ is disposed on the under layer 16. The cap layer 19 is disposed on the magnetoresistive element MTJ. The cap layer 19 serves as a buffer layer which prevents a reaction between the magnetoresistive element MTJ and a top electrode 20. The cap layer 19 comprises, for example, Pt, W, Ta, and Ru.

The top electrode 20 is disposed on the cap layer 19. The top electrode 20 comprises, for example, W, Ta, Ru, Ti, TaN, and TiN.

The top electrode 20 does not only serve as an electrode, but also serves as a mask when patterning the magnetoresistive element MTJ. That is, the top electrode 20 should preferably have low electrical resistance, and comprise a material having good resistance to diffusion, etching, milling, etc., which is, for example, a lamination of Ta/Ru.

A protection insulating layer (for example, a silicon nitride layer) PL covers a side wall of the magnetoresistive element MTJ. An interlayer insulating layer (for example, a silicon oxide layer) 27 is disposed on the protection insulating layer PL, and covers the magnetoresistive element MTJ. An upper surface of the interlayer insulating layer 27 is flat, and bit lines BL1 and BL2 are arranged on the interlayer insulating layer 27.

Bit line BL1 is connected to the top electrode 20 via contact plug (top electrode contact) TEC. Bit line BL2 is connected to contact plug BC1 via contact plug BC2.

In this example, the magnetoresistive element MTJ is larger than contact plug BEC in a direction parallel to a surface of the semiconductor substrate 21 (i.e., an in-plane direction).

Figure 8:
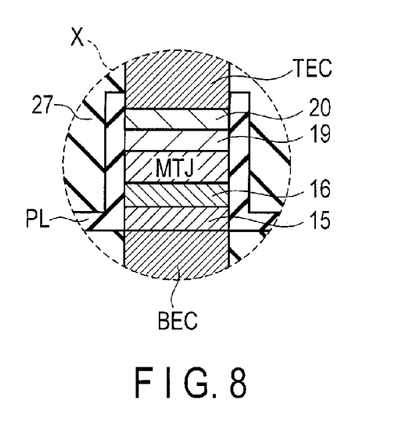
FIGS. 8 and 9 are cross-sectional views showing modifications of region X of FIG. 7.

However, the size is not limited to the above example, and as shown in FIG. 8, for example, the magnetoresistive element MTJ may have the same size as contact plug BEC in the direction parallel to the surface of the semiconductor substrate 21. Also, as shown in FIG. 9, the magnetoresistive element MTJ may be smaller than contact plug BEC in a direction parallel to the surface of the semiconductor substrate 21.

Figure 9:
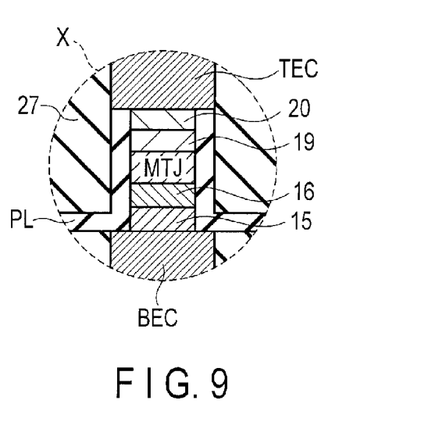

Here, region X in FIGS. 8 and 9 corresponds to region X of FIG. 7.

Figure 10:
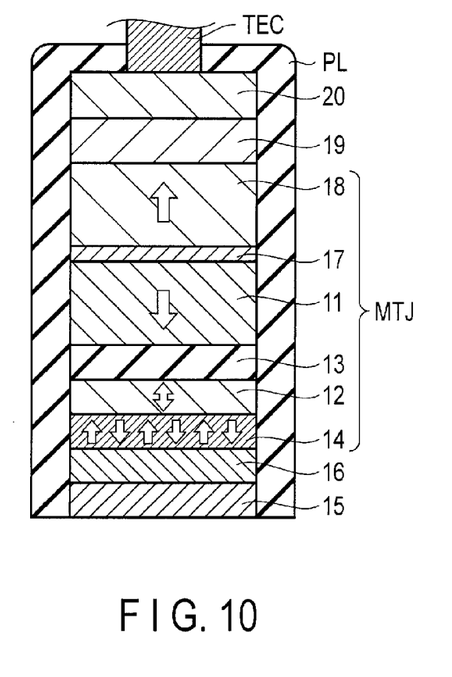
FIG. 10 is a cross-sectional view showing a first example of a magnetoresistive element of FIG. 7.
Figure 11:
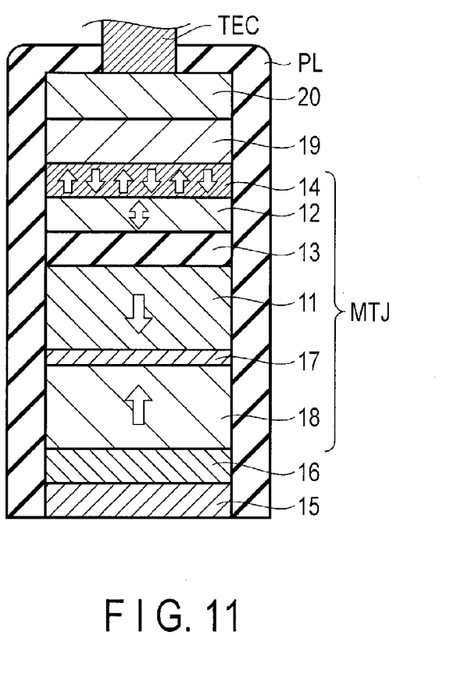
FIG. 11 is a cross-sectional view showing a second example of the magnetoresistive element of FIG. 7.

FIGS. 10 and 11 show examples of the magnetoresistive element shown in FIGS. 7 to 9.

The magnetoresistive element MTJ of FIG. 10 is an example of applying the magnetoresistive element of FIG. 1A to the memory cell of the magnetic memory of FIGS. 7 to 9 as a top-pin type magnetoresistive element.

In this example, the antiferromagnetic conductive layer 14 is disposed on the under layer 16, the second magnetic layer (the storage layer) 12 is disposed on the antiferromagnetic conductive layer 14, the nonmagnetic insulating layer 13 is disposed on the second magnetic layer 12, and the first magnetic layer (the reference layer) 11 is disposed on the nonmagnetic insulating layer 13.

Further, a third magnetic layer (a shift cancellation layer) 18 is disposed over the first magnetic layer 11 with a nonmagnetic conductive layer 17 interposed therebetween. The third magnetic layer 18 has a magnetization direction opposite to the magnetization direction of the first magnetic layer 11, and has the function of cancelling a shift of the magnetization reversal characteristic of the second magnetic layer 12.

That is, the third magnetic layer 18 produces a second stray magnetic field which is opposite to a first stray magnetic field caused by the first magnetic layer 11. Since the first and the second stray magnetic fields cancel each other out, it is possible to cancel the shift of the magnetic reversal characteristic of the second magnetic layer 12.

The cap layer 19 is disposed on the third magnetic layer 18.

Since the other parts are the same as those of the memory cell of the magnetic memory of FIGS. 7 to 9, the same reference numbers are assigned to elements which are the same as those of FIGS. 7 to 9, and explanation of them is omitted.

The magnetoresistive element MTJ of FIG. 11 is an example of applying the magnetoresistive element of FIG. 1A to the memory cell of the magnetic memory of FIGS. 7 to 9 as a bottom-pin type magnetoresistive element.

In this example, the third magnetic layer (the shift cancellation layer) 18 is disposed on the under layer 16, the nonmagnetic conductive layer 17 is disposed on the third magnetic layer 18, the first magnetic layer (the reference layer) 11 is disposed on the nonmagnetic conductive layer 17, and the nonmagnetic insulating layer 13 is disposed on the first magnetic layer 11. Further, the second magnetic layer (the storage layer) 12 is disposed on the nonmagnetic insulating layer 13, and the antiferromagnetic conductive layer 14 is disposed on the second magnetic layer 12.

The cap layer 19 is disposed on the antiferromagnetic conductive layer 14.

As in the structure of FIG. 10, the third magnetic layer 18 has the magnetization direction opposite to the magnetization direction of the first magnetic layer 11, and also has the function of cancelling a shift of the magnetization reversal characteristic of the second magnetic layer 12.

Since the other parts are the same as those of the memory cell of the magnetic memory of FIGS. 7 to 9, the same reference numbers are assigned to elements which are the same as those of FIGS. 7 to 9, and explanation of them is omitted.

Figure 12:
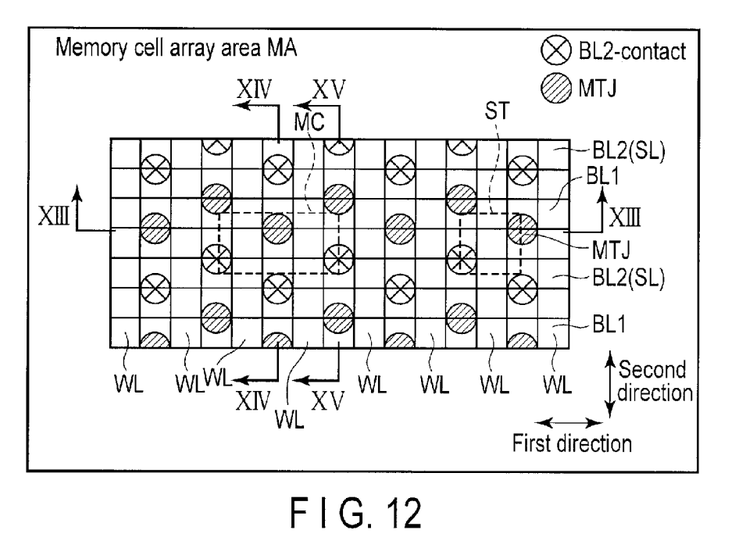
FIG. 12 is a plan view showing an example of a memory cell array.
Figure 13:
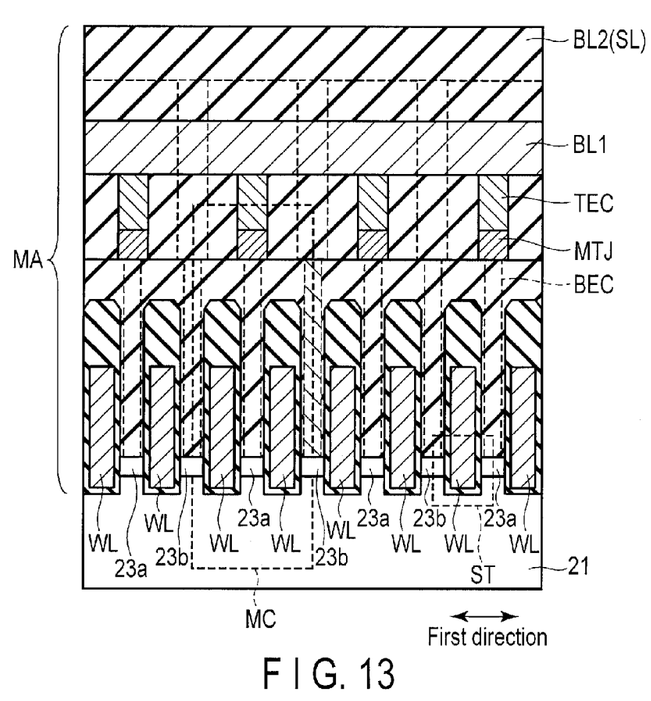
FIG. 13 is a cross-sectional view taken along line XIII-XIII of FIG. 12.
Figure 14:
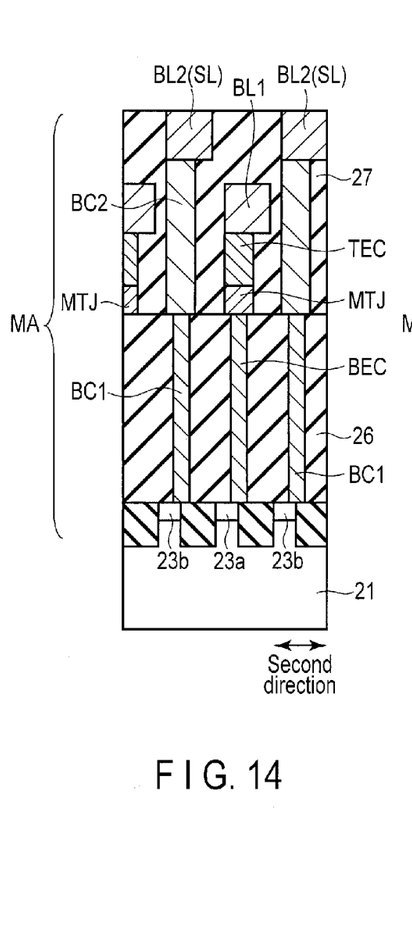
FIG. 14 is a cross-sectional view taken along line XIV-XIV of FIG. 12.
Figure 15:
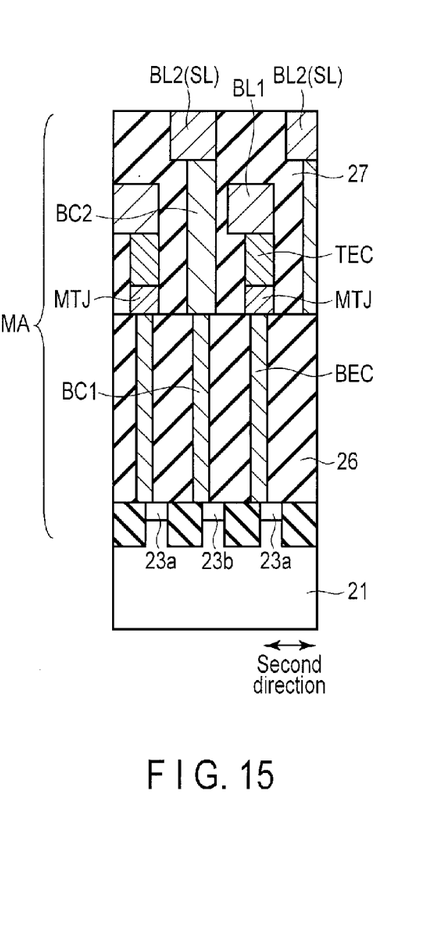
FIG. 15 is a cross-sectional view taken along line XV-XV of FIG. 12.
Figure 16:
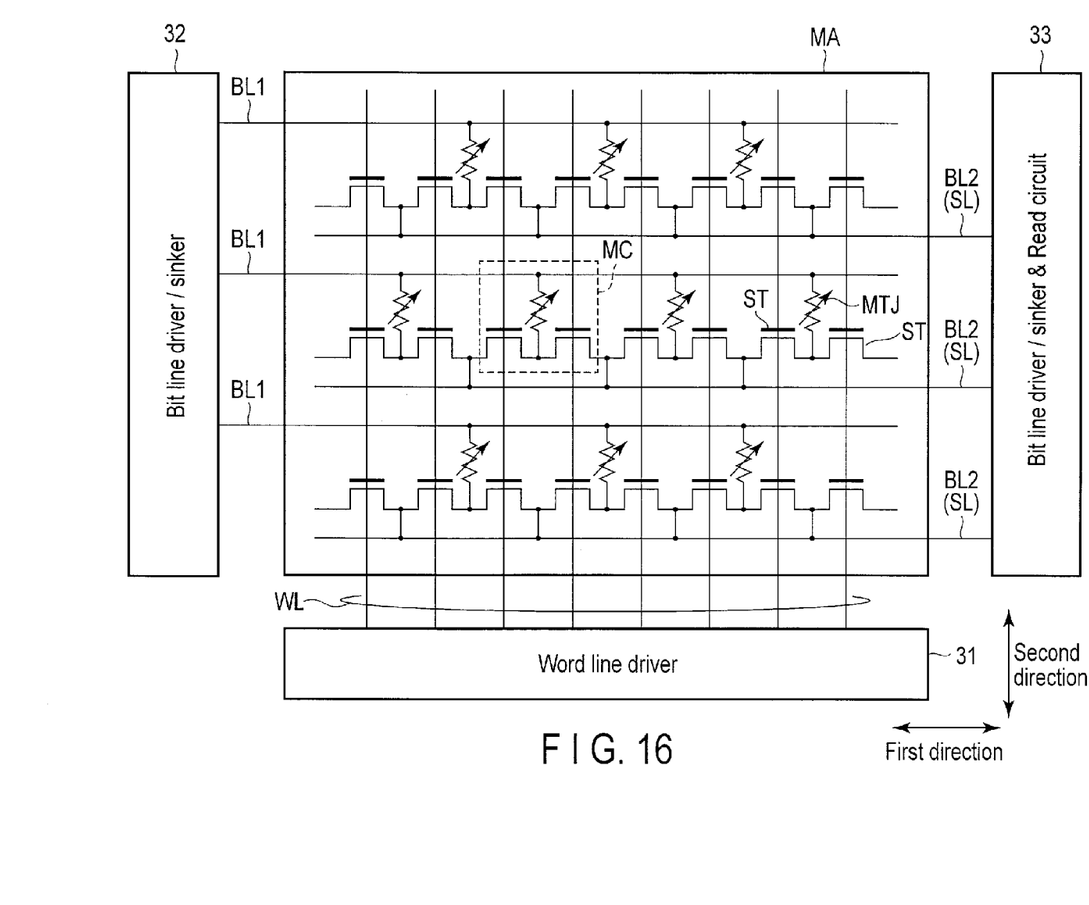
FIG. 16 is a circuit diagram showing an equivalent circuit of the memory cell array area of FIGS. 12 to 15.

FIGS. 12 to 16 show an example of a memory cell array area of a magnetic random-access memory. FIG. 12 is a plan view of the memory cell array area, FIG. 13 is a cross-sectional view taken along line XIII-XIII of FIG. 12, FIG. 14 is a cross-sectional view taken along line XIV-XIV of FIG. 12, and FIG. 15 is a cross-sectional view taken along line XV-XV of FIG. 12. FIG. 16 shows an equivalent circuit of the memory cell array area of FIGS. 12 to 15.

In FIGS. 12 to 15, the same reference numbers are assigned to elements which are the same as those of FIGS. 7 to 11.

In this example, the so-called two-transistor-one-element-type memory cell, in which a single memory cell MC within a memory cell array area MA includes two select transistors ST and one magnetoresistive element MTJ, will be described. However, this does not mean that the embodiment described above is applied to only this type. That is, the above embodiment can be applied to other types of memory cells in the memory cell array area MA, such as a one-transistor-one-element-type memory cell and a cross-point-type memory cell.

On the semiconductor substrate 21, memory cells MC are arranged as an array. The memory cell MC comprises two select transistors ST on the semiconductor substrate 21, and one magnetoresistive element MTJ which is connected to the two select transistors ST in common.

Each of the select transistors ST comprises the source/drain diffusion layers 23a and 23b in the semiconductor substrate 21, and a word line WL as a gate electrode on a channel between the source/drain diffusion layers 23a and 23b. The word line WL extends in a second direction, and is connected to a word line driver 31.

The magnetoresistive element MTJ is disposed above the source/drain diffusion layer 23a, and is connected to the source/drain diffusion layer 23a. Also, bit line BL1 is disposed above the magnetoresistive element MTJ, and is connected to the magnetoresistive element MTJ. Bit line BL1 extends in a first direction, and is connected to a bit line driver/sinker 32.

Bit line BL2 is disposed above the source/drain diffusion layer 23b, and is connected to the source/drain diffusion layer 23b. Bit line BL2 also serves as a source line SL which is connected to, for example, a sense amplifier, at the time of a read operation. Bit line BL2 extends in the first direction, and is connected to a bit line driver/sinker & read circuit 33.

The layout of the memory cell array area of the example is only exemplification, and it may be changed as needed. For example, in this example, when the memory cell array area MA is seen from above the semiconductor substrate 21, a mutual positional relationship among the source/drain diffusion layers 23a and 23b, the magnetoresistive element MTJ, and bit line BL1 is shifted in the second direction. However, whether the aforementioned constituent elements are shifted, and the shift amount can be changed as appropriate.

Also, in this example, while bit lines BL1 and BL2 are formed in different interconnect layers, they may be formed in the same interconnect layer.

Figure 17:
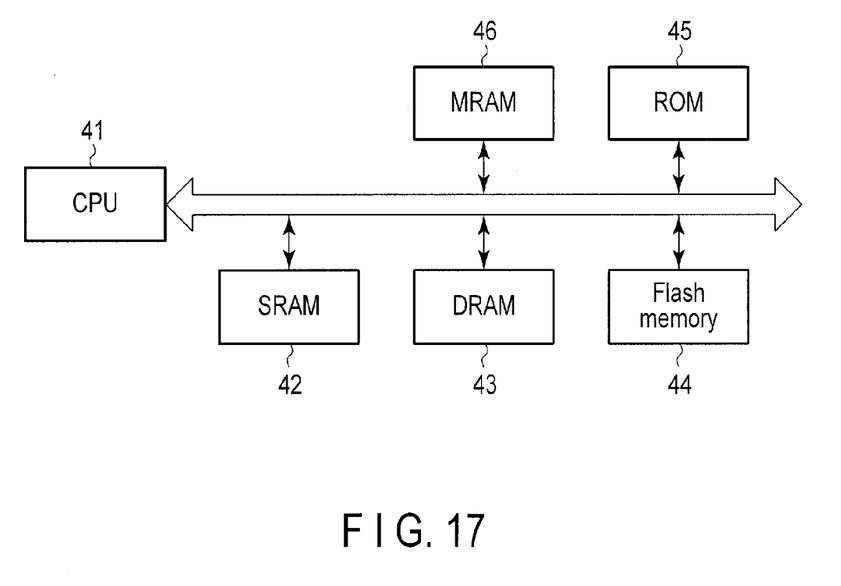
FIG. 17 is a block diagram showing an example of a memory system in a processor.

FIG. 17 shows an example of a memory system in a processor.

A CPU 41 controls an SRAM 42, a DRAM 43, a flash memory 44, a ROM 45, and a magnetic random-access memory (MRAM) 46.

The embodiment described above is applied to the memory cell (the magnetoresistive element) within the MRAM 46.

The MRAM 46 can be used as a substitute for any of the SRAM 42, the DRAM 43, the flash memory 44, and the ROM 45. Accordingly, at least one of the SRAM 42, the DRAM 43, the flash memory 44, and the ROM 45 may be omitted.

The MRAM 46 can be used as a nonvolatile cache (for example, an L2 cache).

3. Conclusion

As described above, according to the present embodiment, it is possible to improve the situation of a trade-off between reduction of a write current necessary for the magnetic reversal of the storage layer and magnetic stability of the storage layer after writing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
   a first magnetic layer as a reference layer;
   a second magnetic layer as a storage layer;
   a nonmagnetic insulating layer between the first and second magnetic layers; and
   an antiferromagnetic conductive layer which is adjacent to a side opposite to a nonmagnetic insulating layer side of the second magnetic layer in a vertical direction in which the first and second magnetic layers are stacked,
   wherein the second magnetic layer includes an area which is magnetically coupled with the antiferromagnetic conductive layer and which has a magnetization direction parallel with a magnetization direction of the second magnetic layer.

2. The element of claim 1, wherein each of the first and second magnetic layers has remanent magnetization in the vertical direction, and the area has the magnetization direction in the vertical direction.

3. The element of claim 1, wherein the area has the magnetization direction opposite to a magnetization direction of the first magnetic layer.

4. The element of claim 1, further comprising:
   a nonmagnetic conductive layer between the second magnetic layer and the antiferromagnetic conductive layer.

5. The element of claim 1, wherein the antiferromagnetic conductive layer comprises one of PtMn, PdMn, IrMn, RhMn, RuMn, NiMn, FeMn, CoMn, and CrMn.

6. The element of claim 1, further comprising:
   a third magnetic layer having a magnetization direction opposite to a magnetization direction of the first magnetic layer.

7. The element of claim 6, further comprising:
   a nonmagnetic conductive layer between the first magnetic layer and the third magnetic layer.

8. The element of claim 1, wherein the magnetization direction of the second magnetic layer is changed by a write current which flows between the first and second magnetic layers.

9. A magnetoresistive element comprising:
   a first magnetic layer as a reference layer;
   a second magnetic layer as a storage layer;
   a nonmagnetic insulating layer between the first and second magnetic layers; and
   a conductive layer which is adjacent to a side opposite to a nonmagnetic insulating layer side of the second magnetic layer in a vertical direction in which the first and second magnetic layers are stacked,
   wherein the conductive layer comprises one of PtMn, PdMn, IrMn, RhMn, RuMn, NiMn, FeMn, CoMn, and CrMn.

10. The element of claim 9, wherein the second magnetic layer includes an area which is magnetically coupled with the conductive layer and which has a magnetization direction parallel with a magnetization direction of the second magnetic layer.

11. The element of claim 10, wherein each of the first and second magnetic layers has remanent magnetization in the vertical direction, and the area has a magnetization direction in the vertical direction.

12. The element of claim 10, wherein the area has the magnetization direction opposite to a magnetization direction of the first magnetic layer.

13. The element of claim 9, further comprising:
   a nonmagnetic conductive layer between the second magnetic layer and the conductive layer.

14. The element of claim 9, further comprising:
   a third magnetic layer having a magnetization direction opposite to a magnetization direction of the first magnetic layer.

15. The element of claim 14, further comprising:
   a nonmagnetic conductive layer between the first magnetic layer and the third magnetic layer.

16. The element of claim 9, wherein a magnetization direction of the second magnetic layer is changed by a write current which flows between the first and second magnetic layers.

17. The element of claim 1, wherein the magnetization direction of the area of the second magnetic layer is parallel with the magnetization direction of the second magnetic layer after a write operation.

18. The element of claim 9, wherein a magnetization direction of an area of the second magnetic layer is parallel with a magnetization direction of the second magnetic layer after a write operation.

* * * * *